United States Patent
Kuo et al.

(10) Patent No.: US 8,816,731 B2
(45) Date of Patent: *Aug. 26, 2014

(54) PHASE-LOCKED LOOPS THAT SHARE A LOOP FILTER

(71) Applicant: Taiwan Semiconductor Manufacturing Company, Ltd., Hsinchu (TW)

(72) Inventors: Feng Wei Kuo, Zhudong Township (TW); Shyh-An Chi, Hsinchu (TW); Huan-Neng Chen, Taichung (TW); Yen-Jen Chen, Taipei (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/025,125

(22) Filed: Sep. 12, 2013

(65) Prior Publication Data

US 2014/0015576 A1 Jan. 16, 2014

Related U.S. Application Data

(63) Continuation of application No. 13/407,394, filed on Feb. 28, 2012, now Pat. No. 8,547,151.

(60) Provisional application No. 61/565,271, filed on Nov. 30, 2011.

(51) Int. Cl.
*H03L 7/06* (2006.01)

(52) U.S. Cl.
USPC .................................. 327/156; 327/148

(58) Field of Classification Search
None
See application file for complete search history.

(56) References Cited

U.S. PATENT DOCUMENTS

| | | |
|---|---|---|
| 5,977,806 A | 11/1999 | Kikuchi |
| 6,201,448 B1 | 3/2001 | Tam et al. |
| 7,472,304 B2 | 12/2008 | Malekkhosravi et al. |

*Primary Examiner* — Cassandra Cox (74) *Attorney, Agent, or Firm* — Lowe Hauptman & Ham, LLP (57) ABSTRACT

An integrated circuit includes a first die and a second die. The first die comprising a first phase-locked loop (PLL) and the second die comprising a second PLL. The integrated circuit includes a shared loop filter, wherein the first PLL in the first die is combined with the shared loop filter to form a first PLL feedback loop, the second PLL in the second die is combined with the shared loop filter to form a second PLL feedback loop and the shared loop filter is configured to provide configurable bandwidths to each of the first PLL feedback loop and the second PLL feedback loop.

20 Claims, 7 Drawing Sheets

PHASE-LOCKED LOOPS THAT SHARE A LOOP FILTER

CROSS-REFERENCE TO RELATED APPLICATION

The present application is a continuation of U.S. application Ser. No. 13/407,394, filed Feb. 28, 2013, which claims priority of U.S. Provisional Application No. 61/565,271, filed Nov. 30, 2011, which are incorporated herein by reference in their entireties.

FIELD OF DISCLOSURE

The present disclosure is related to phase-locked loops (PLLs) that share a loop filter.

BACKGROUND

With a progress in the technology of die manufacturing and packaging, three-dimensional integrated circuits (3DICs) have been developed in which two or more dies are integrated vertically and/or horizontally in a single die stack. Depending on the functional requirement, each stacked die includes a PLL to generate an individual clock. The frequencies of the clocks in each of the stacked dies therefore vary. Further, existing PLLs generally occupy a large die area and therefore increase the total die area of each stacked die.

DETAILED DESCRIPTION

The making and using of the embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

Some embodiments have one or a combination of the following features and/or advantages. Each die in a die stack includes a PLL. The PLLs in each die of the die stack share a loop filter. As a result, the size of each stacked die is smaller, resulting in additional functions being provided in a same die size area. In other words, the functional capacity per volume unit of each die is higher. By sharing the loop filter, the clock phase of the clocks of the PLLs take turns to lock with a reference clock.

Figure 1:
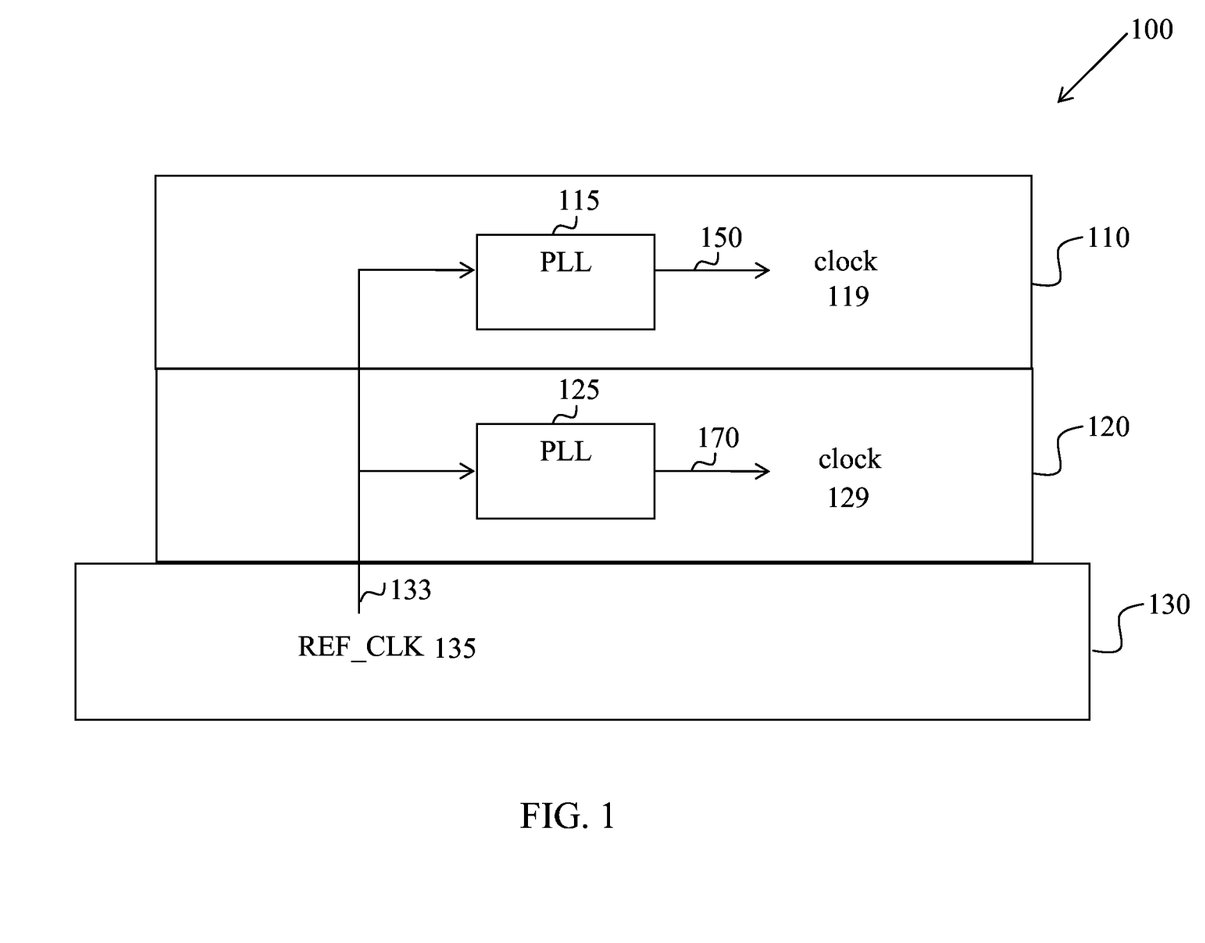
FIG. 1 is a block diagram illustrating clock generation for each die in a die stack in accordance with some embodiments.

FIG. 1 is a block diagram of a die stack 100 illustrating the clock generation for each die in a die stack, according to an example embodiment. The die stack 100 includes dies 110, 120 and an interposer 130. In some embodiments, each of dies 110 and 120 is symmetrically and/or asymmetrically stacked on the interposer 130, either on the same side or on the different side of the interposer 130. In some embodiments, the dies 110 and 120 are heterogeneous dies. In some other embodiments, the dies 110 and 120 are homogeneous dies. In some embodiments, the interposer 130 provides connections between the die stack 100 and external inputs/outputs (I/O)s. The interposer 130 is formed of materials such as semiconductor materials, dielectric materials, or the like. In various embodiments, the interposer 130 is a printed circuit board (PCB), an integrated circuit carrier board, or any other board. Although FIG. 1 only shows two dies 110 and 120 stacked on the interposer 130, any number of dies is within the scope of various embodiments.

A clock signal REF_CLK 135 on an electrical connection 133 may be generated by circuitries located in the interposer 130 or in other dies mounted on the interposer 130, such as die 110, 120, etc. The clock signal REF_CLK 135 is electrically connected to PLLs 115 and 125 of dies 110 and 120, respectively. In some embodiments, the clock signal REF_CLK 135 is a periodic clock signal generated from a reference clock source, such as a crystal oscillator. The PLL 115 and 125 output clocks 119 and 129 through electrical connections 150 and 170, respectively. In some embodiments, clocks 119 and 129 are transmitted to and usable by other circuit blocks of the dies 110 and 120, respectively. The electrical connection referred in this document may be any form of interconnections, such as metal, vias, poly, quantum lines or dots (OD), redistribution layer (RDL), through substrate vias (TSVs), or any conductor made of other materials.

Figure 2A:
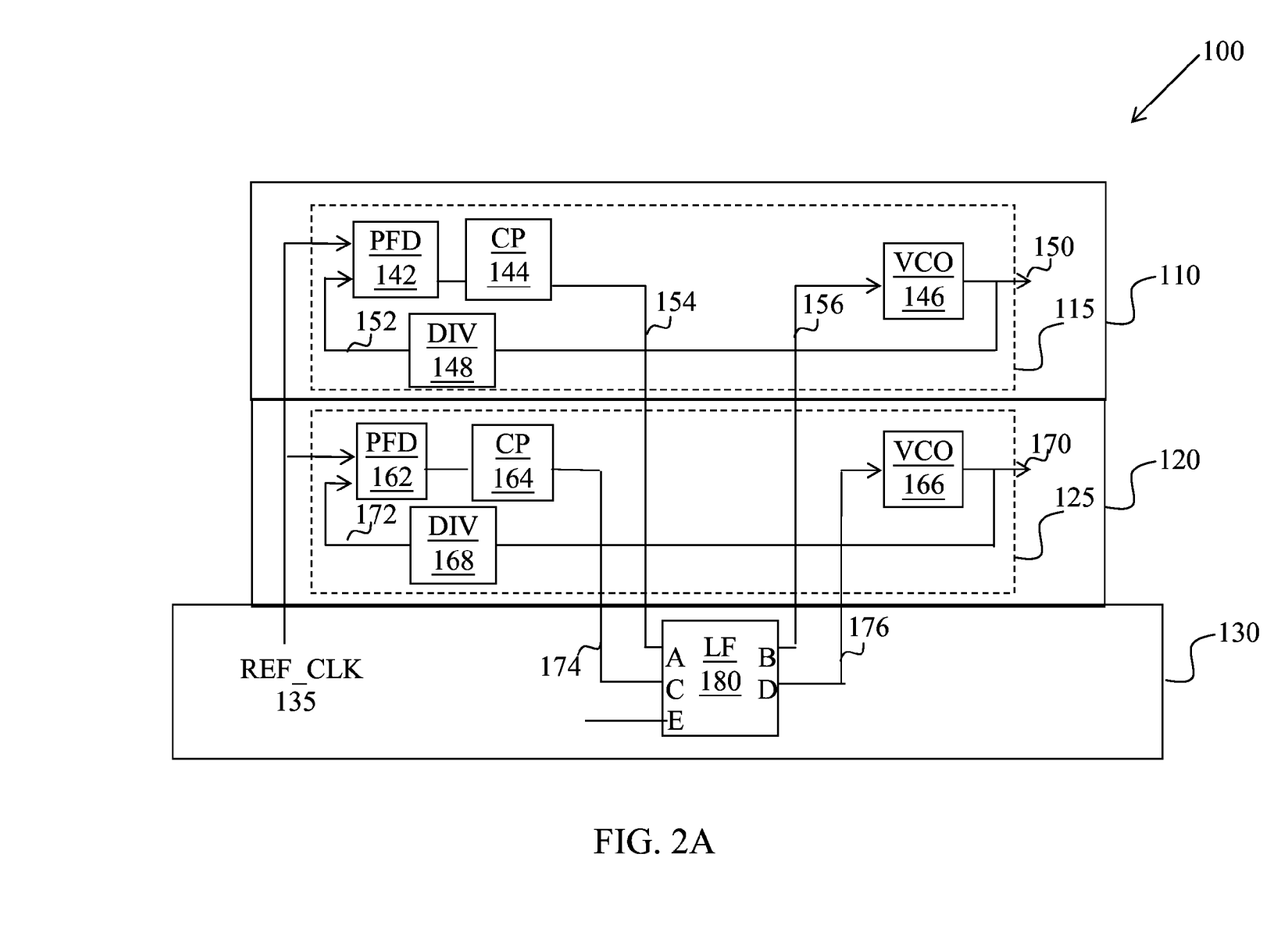
FIG. 2A is a block diagram illustrating a clock generation means for each die in a die stack in accordance with some embodiments.

With reference to FIG. 2A, die stack 100 is shown in detail, according to an example embodiment. The dies 110 and 120 include PLLs 115 and 125, respectively. In some embodiments, the PLL 115 is similar to the PLL 125. The interposer 130 includes a loop filter LF 180 to be shared by the PLLs 115 and 125.

The PLL 115 includes a phase and frequency detector (PFD) 142, a charge pump (CP) 144, a voltage controlled oscillator (VCO) 146, and a feedback divider (DIV) 148. The PFD 142 receives two inputs, a clock signal REF_CLK 135 and a local clock signal 152, which is a divided version of an output clock of the VCO 146 through electrical connection 150. The PFD 142 determines the relative phase difference between the REF_CLK 135 and the local clock signal 152, and outputs a signal that is proportional to the phase difference and that is fed into the CP 144. The CP 144 converts the input signal into an analog voltage and feeds this analog voltage to a port A of the LF 180 in the interposer 130 through an electrical connection 154. In some embodiments, the LF 180 is a low-pass filter that removes the high frequency components in the analog voltage outputted by the CP 144, and outputs a DC voltage. The DC voltage is outputted from a port B of the LF 180 and fed to the VCO 146 through the electrical connection 156. The VCO 146 increases or decreases the frequency of the output clock on the electrical connection 150 according to the corresponding increased or decreased DC voltage. The DIV 148 receives the output clock through electrical connection 150 and provides the local clock signal 152 to PFD 142. The frequency of the local clock signal 152 is divided from the frequency of the output clock on electrical connection 150 by a predetermined ratio. As illustratively shown in FIG. 2A, elements of the PLL 115, combined with the LF 180, form a feedback loop. For example, PFD 142, CP 144, LF 180, VCO 146, and DIV 148 form the feedback loop.

Similarly, the PLL 125 includes a phase and frequency detector (PFD) 162, a charge pump (CP) 164, a voltage controlled oscillator (VCO) 166, and a feedback divider (DIV) 168. The connectivity in the PLL 125 is similar to that of the PLL 115, except that an analog voltage outputted from the CP 164 is fed to a port C of the LF 180 through electrical connection 174, and a DC voltage outputted from a port D of the LF 180 is fed to the VCO 166 through electrical connection 176. As a result, elements of the PLL 125, together with the LF 180, form another feedback loop. For example, PFD 162, CP 164, LF 180, VCO 166, and DIV 168 form the second feedback loop. As illustratively shown in FIG. 2A, the PLLs 115 and 125 share the common LF 180 in the interposer 130. In some embodiments, a circuit (not shown) generates a selection signal to a port E of the LF 180 to select the feedback loop that uses the common LF 180 at a particular period of time. The circuit may be located in the interposer 130 or in one of the dies stacked on the interposer 130, such as a die 110, a die 120, etc.

In FIG. 2A, the LF 180 is placed in the interposer 130 for illustration. The LF 180, however, may be placed in the dies 110, 120, or another die stacked on the interposer 130.

Figure 2B:
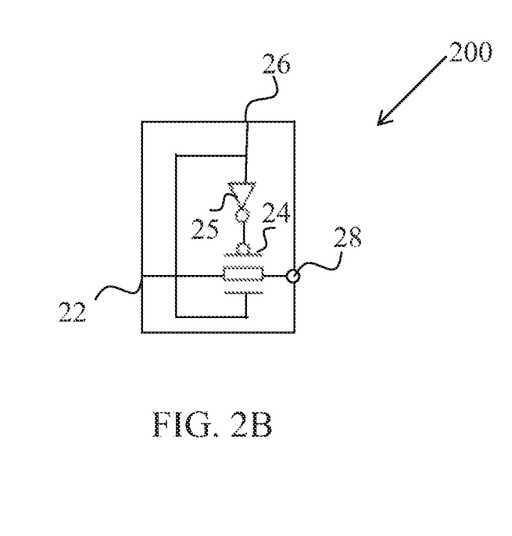
FIG. 2B is a schematic view of a programmable connection element in accordance with some embodiments.

FIG. 2B is a schematic of a programmable connection element 200 according to an example embodiment. Programmable connection element 200 is for use by the LFs 300 and 400 in the corresponding FIGS. 3 and 4, in accordance with some embodiments. A transmission gate 24 is used to connect electrical ports 22 and 28, with a switch control (not shown) from electrical port 26. The programmable connection element 200 is activated to electrically connect the electrical port 22 to the electrical port 28 when the electrical port 26 receives a logical high voltage. In contrast, the programmable connection element 200 is disabled to electrically disconnect the electrical port 22 from the electrical port 28 when the electrical port 26 receives a logical low voltage. An inverter 25 inverts the signal on electrical port 26 and provides a signal that controls the transmission gate 24.

Figure 3:
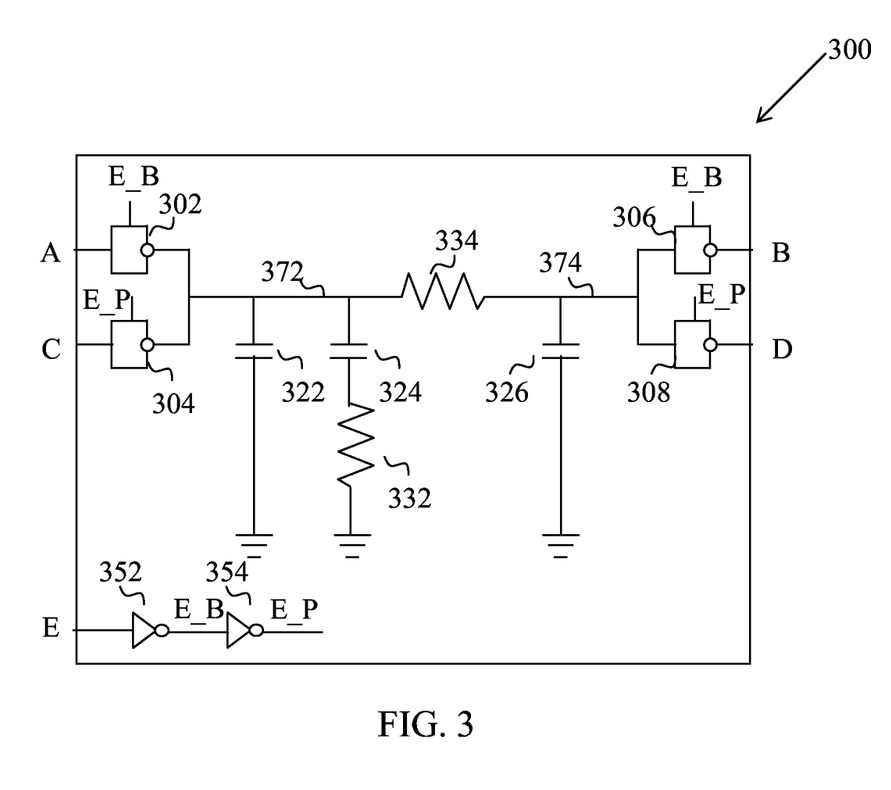
FIG. 3 is a schematic diagram of the loop filter in accordance with some embodiments.

FIG. 3 is a loop filter 300 illustrating an implementation of the LF 180 in FIG. 2, according to an example embodiment. The loop filter 300 comprises programmable connection elements 302, 304, 306 and 308; capacitors 322, 324 and 326; and resistors 332 and 334. The programmable connection elements 302, 304, 306 and 308 are implemented using the programmable connection element 200 shown in FIG. 2B. For illustration, ports indicated by a circle for the programmable connection elements 302, 304, 306 and 308 in FIG. 3 correspond to the electrical port 28 shown in FIG. 2B. The ports positioned on the opposite side of the electrical port 28 of programmable connection elements 302, 304, 306 and 308 correspond to the electrical port 22 shown in FIG. 2B and the remaining port corresponds to the electrical port 26 shown in FIG. 2B.

The programmable connection element 302 controls a connection between a port A of the LF 300 and an electrical connection 372. The programmable connection element 304 controls a connection between a port C of the LF 300 and the electrical connection 372. The programmable connection element 306 controls a connection between electrical connection 374 and a port B of the LF 300. The programmable connection element 308 controls a connection between the electrical connection 374 and a port D of the LF 300. Signals used to connect to the corresponding electrical port 26 shown in FIG. 2B are generated from the selection signal on port E of the LF 300. For example, a signal E_B, which is connected to a port E through inverter 352, is connected to the corresponding electrical port 26 shown in FIG. 2B of programmable connection elements 302 and 306. In addition, a signal E_P, which is connected to a port E through inverter 352 and 354, is connected to the corresponding electrical port 26 shown in FIG. 2B of programmable connection elements 304 and 308.

Capacitor 322 is connected between the electrical connection 372 and a ground. Capacitor 324 and resistor 332 are serially connected between the electrical connection 372 and the ground. Capacitor 326 is connected between the electrical connection 374 and the ground. Resistor 334 is connected between the electrical connection 372 and 374.

Inverter 352 inverts the signal on the port E to provide signal E_B while inverter 354 inverts signal E_B to provide signal E_P. As a result, when the port E is logically low, the signal E_B is logically high and the signal E_P is logically low. The programmable connection elements 302 and 306 are therefore activated while the programmable connection elements 304 and 308 are disabled. As a result, there is an electrical connection between the port A and the port B through the programmable connection element 302, the electrical connection 372, the resistor 334, the electrical connection 374 and the programmable connection element 306. There is, however, no electrical connection between the port C and the port D because the programmable connection elements 304 and 308 are disabled. In contrast, when the port E is logically high, the signal E_B is logically low and the signal E_P is logically high. The programmable connection elements 302 and 306 are therefore disabled while the programmable connection elements 304 and 308 are activated. As a result, there is no electrical connection between the port A and the port B because the programmable connection elements 302 and 306 are disabled. There is, however, an electrical connection between the port C and the port D through the programmable connection element 304, the electrical connection 372, the resistor 334, the electrical connection 374 and the programmable connection element 308.

In FIG. 3, the capacitors 322, 324 and 326 are placed at the same die as the resistors 332 and 334. The capacitors 322, 324 and 326, however, may be placed at different levels of hierarchy in a die stack as the resistors 332 and 334. For example, in some embodiments, the capacitors 322, 324 and 326 are placed in the interposer 130 in FIG. 2A while the resistors 332 and 334 are placed in the die 110 in FIG. 2A or a PC board that the interposer 130 is stacked on. In some other embodiments, at least one of the capacitors 322, 324 and 326 or the resistors 332 and 334 may be placed at a different level of hierarchy in a die stack. For example, all of the capacitors and resistors are located in the interposer 130 except that the resistor 332 is located in the die 110 or a PC board that the interposer 130 is stacked on. The resistors 332 and 334 may be formed by metal routing, poly routing, OD routing, external resistor component, or the like. The capacitors 322, 324 and 326 may be formed by Metal-Insulator-Metal (MIM) capacitors and/or Metal-Oxide-Metal (MOM) capacitors, or the like.

In FIG. 2, the PLL 115 is similar to the PLL 125 for ease of illustration. The PLL 115, however, may be different from the PLL 125. For example, in some embodiments, the VCO 146 in the PLL 115 is designed to output a 5 GHz clock, while the VCO 166 in the PLL 125 is designed to output a 1 GHz clock. In such a situation, the LF 180 is configured and adaptively controlled to provide corresponding bandwidths to corresponding feedback loops, as described in detail in FIG. 4.

Figure 4:
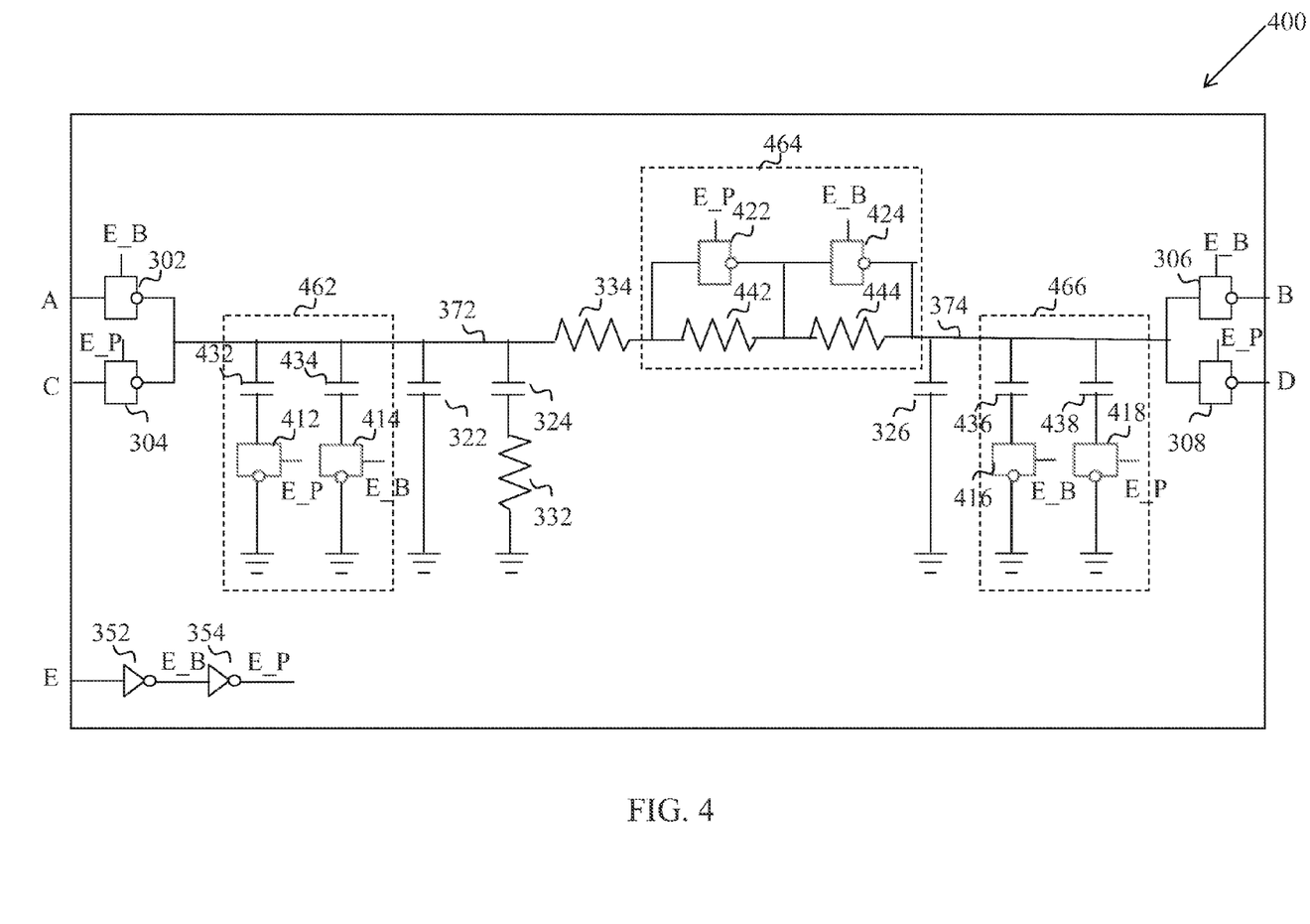
FIG. 4 is a schematic diagram of the loop filter in accordance with some further embodiments.

FIG. 4 is a loop filter 400 illustrating another implementation of the LF 180 in FIG. 2, according to another example embodiment. The loop filter 400 is similar to the loop filter 300 in FIG. 3, except with additional circuits 462, 464 and 466. The circuit 462 includes capacitor 432 and programmable connection element 412 that are serially connected between the electrical connection 372 and the ground. The circuit 462 also includes capacitor 434 and programmable connection element 414 that are serially connected between the electrical connection 372 and the ground. The circuit 466 includes capacitor 436 and programmable connection element 416 that are serially connected between the electrical connection 374 and the ground. The circuit 466 also includes capacitor 438 and programmable connection element 418 that are serially connected between the electrical connection 374 and the ground. The circuit 464 is serially connected between the resistor 334 and the electrical connection 374, and includes resistors 442 and 444, and programmable connection elements 422 and 424. In circuit 464, the resistor 442 that is in parallel with the programmable connection element 422 is serially connected with the resistor 444. Resistor 444 is connected in parallel with the programmable connection element 424. In some embodiments, the programmable connection elements 412, 414, 422, 424, 416, and 418 are implemented using the programmable connection element 200 shown in FIG. 2B.

The signal E_B is connected to the corresponding electrical port 26 shown in FIG. 2B of programmable connection elements 414, 416 and 424. The signal E_P is connected to the corresponding electrical port 26 shown in FIG. 2B of programmable connection elements 412, 418 and 422. When the port E is logically low, the signal E_B is logically high and E_P is logically low. The programmable connection elements 414, 416 and 424 are therefore activated while the programmable connection elements 412, 418 and 422 are disabled. As a result, the capacitor 434 is configured to connect the electrical connection 372 and the ground. Similarly, the capacitor 436 is configured to connect the electrical connection 374 and the ground. In addition, the resistor 442 is configured to connect the resistor 334 and the electrical connection 374. In contrast, when the port E is logically high, the signal E_B is logically low and E_P is logically high. The programmable connection elements 414, 416 and 424 are therefore disabled while the programmable connection elements 412, 418 and 422 are activated. As a result, the capacitor 432 is configured to connect the electrical connection 372 and the ground. Similarly, the capacitor 438 is configured to connect the electrical connection 374 and the ground. In addition, the resistor 444 is configured to connect the resistor 334 and the electrical connection 374. In this way, the total effective capacitance of capacitor 322 and 326, and the total effective resistance of resistor 334 are configurable to change in order to provide designated bandwidths for corresponding PLL feedback loops.

In FIG. 4, the capacitors 322, 324, 326, 432, 434, 436 and 438 are placed at the same die as the resistors 332, 334, 442 and 444. The capacitors 322, 324, 326, 432, 434, 436 and 438, however, may be placed at different levels of hierarchy in a die stack as the resistors 332, 334, 442 and 444. For example, the capacitors 322, 324, 326, 432, 434, 436 and 438 are placed at the interposer 130 in FIG. 2A while the resistors 332, 334, 442 and 444 are placed in the die 110 in FIG. 2A or a PC board that the interposer 130 is stacked on. In other embodiments, at least one of the capacitors 322, 324, 326, 432, 434, 436, 438 or the resistors 332, 334, 442 and 444 may be placed at a different level of hierarchy in a die stack. For example, all of the capacitors and resistors are located in the interposer 130 except that the resistor 332 is located in the die 110 or a PC board that the interposer 130 is stacked on. The resistors 332, 334, 442 and 444 may be formed by metal routing, poly routing, OD routing, external resistor component, or the like. The capacitors 322, 324, 326, 432, 434, 436 and 438 may be formed by Metal-Insulator-Metal (MIM) capacitors and/or Metal-Oxide-Metal (MOM) capacitors, or the like.

Figure 5:
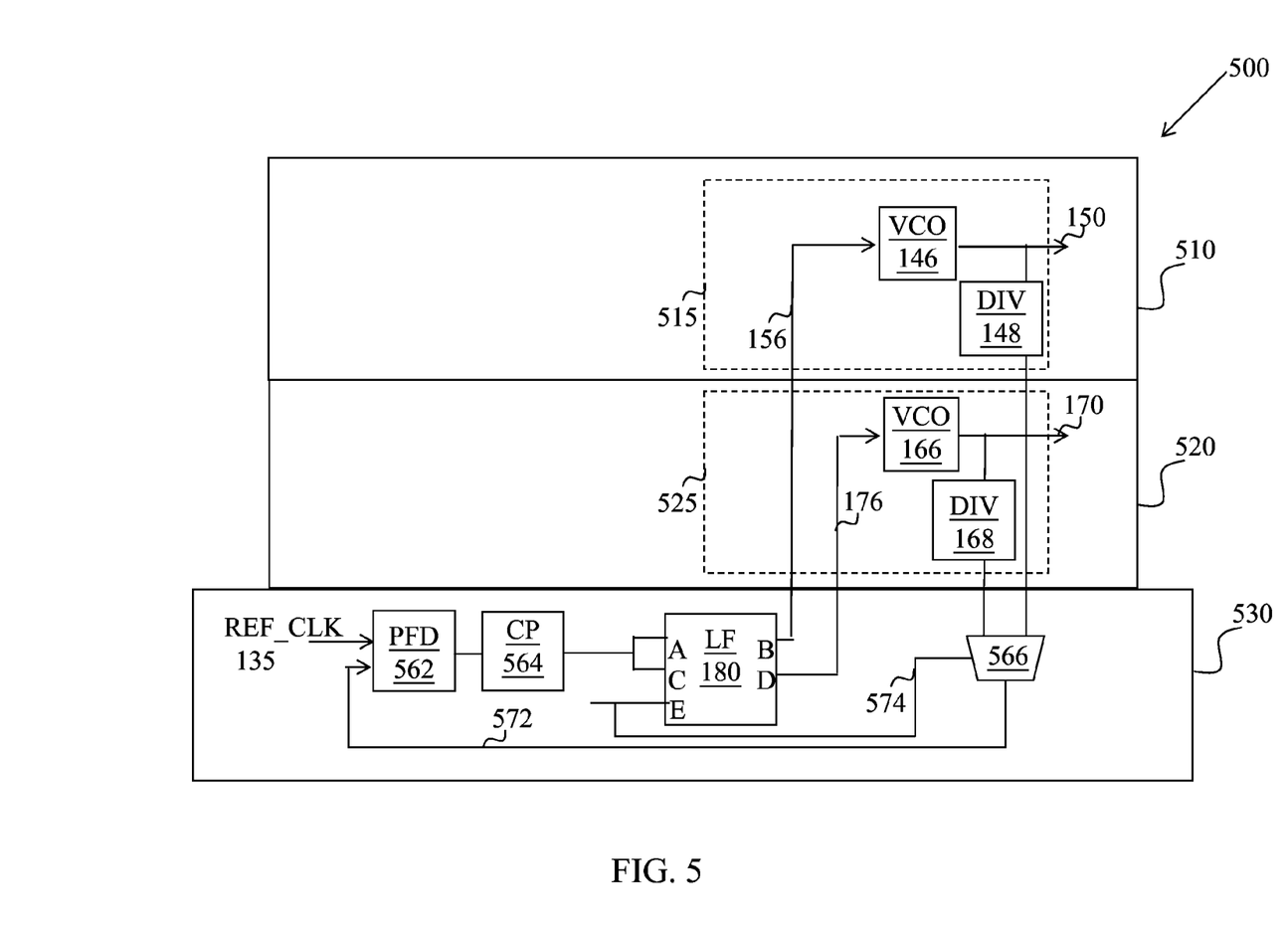
FIG. 5 is a block diagram illustrating another clock generation means for each die in a die stack in accordance with some embodiments.

With reference to FIG. 5, die stack 500 illustrates another clock generation means of each die in a die stack of FIG. 1, according to an example embodiment. The die stack 500 includes dies 510 and 520 and an interposer 530. The dies 510 and 520 include clock generation circuits 515 and 525, respectively. The interposer 530 includes a PFD 562, a CP 564, a LF 180 and a multiplexer 566. The PFD 562 is similar to the PFD 142 or 162 in FIG. 2. The CP 564 is similar to the CP 144 or 164 in FIG. 2. The LF 180 may be implemented using the LF 300 in FIG. 3 or the LF 400 in FIG. 4. The clock generation circuit 515 includes a VCO 146 and a DIV 148. A DC voltage outputted from the LF 180 is fed to the VCO 146 through an electrical connection 156. The VCO 146 outputs a clock to electrical connection 150, which is also fed to the multiplexer 666 through the DIV 148, and then connected to the PFD 562 through an electrical connection 572. As a result, the PFD 562, the CP 564, the LF 180, the multiplexer 566 combined with clock generation circuit 515 form a PLL feedback loop. For example, PFD 562, CP 564, LF 180, VCO 146, DIV 148, and multiplexer 566 form the feedback loop.

Similarly, the clock generation circuit 525 includes a VCO 166 and a DIV 168. A DC voltage outputted from the LF 180 is fed to the VCO 166 through an electrical connection 176. The VCO 166 outputs a clock to electrical connection 170, which is also fed to the multiplexer 566 through the DIV 168, and then connected to the PFD 562 through the electrical connection 572. As a result, the PFD 562, the CP 564, the LF 180, and the multiplexer 566 together with clock generation circuit 525 form another PLL feedback loop. For example, PFD 562, CP 564, LF 180, VCO 166, DIV 168, and multiplexer 566 form the feed back loop.

In FIG. 5, the PFD 562, the CP 564, the LF 180 and the multiplexer 566 are placed in the interposer 130 for ease of illustration. The PFD 562, the CP 564, the LF 180 or the multiplexer 566, however, may be placed in the dies 110, 120, or other die stacked on the interposer 130.

Figure 6:
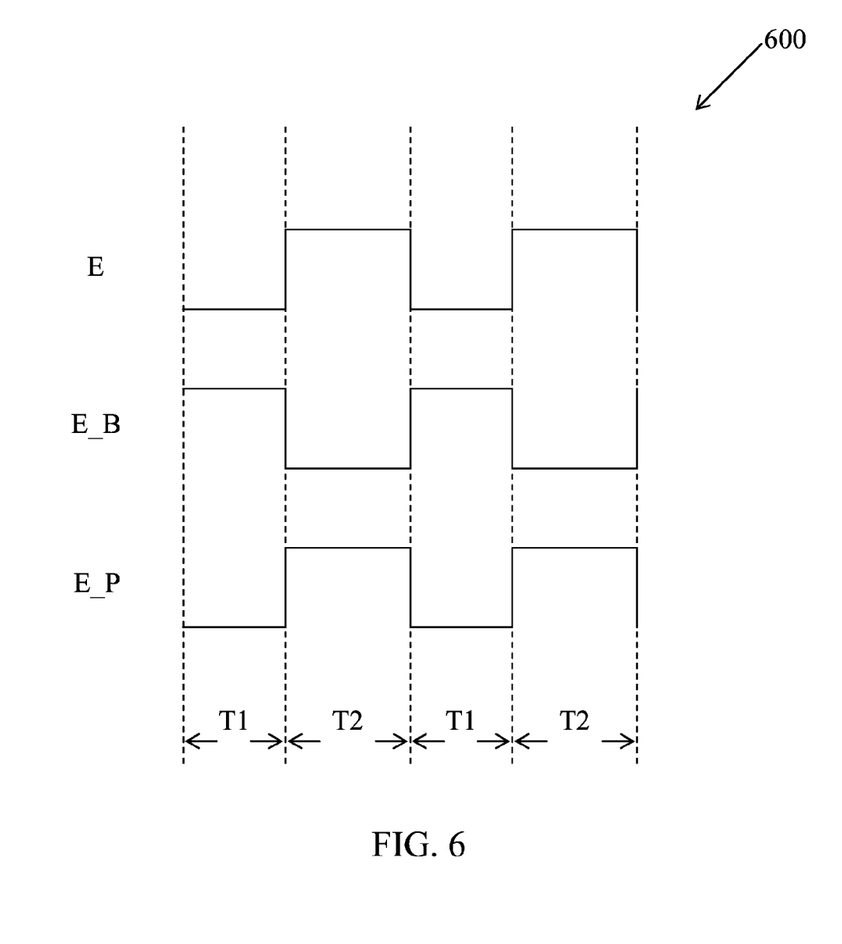
FIG. 6 illustrates a waveform view of a selection signal on port E of the loop filter in accordance with some embodiments.

With reference to FIG. 6, waveform 600 illustrates the relationship of feedback loop selection signals, according to an example embodiment. In time period T1, the selection signal on the port E and the signal E_P are logically low, and the signal E_B is logically high. As a result, the feedback loop that includes the PLL 115 in FIG. 2A or the clock generation circuit 515 in FIG. 5 is a closed loop. The clock phase of the clock on the electrical connection 150 in FIG. 2A or FIG. 5 is locked with regard to the clock REF_CLK 135 within the corresponding time period T1. In time period T2, the selection signal on the port E and the signal E_P are logically high, and the signal E_B is logically low. As a result, the feedback loop that includes the PLL 125 in FIG. 2A or the clock generation circuit 525 in FIG. 5 is a closed loop. The clock phase of the clock on the electrical connection 170 in FIG. 2A or FIG. 5 is locked to the signal REF_CLK 135 within the corresponding time period T2. Time period T1 is followed by time period T2, which is in turn followed by time period T1. This periodic phase locking for each of the feedback loops is performed continuously during functional operations of the die stack 100 or 500. In some embodiments, the time period T1 is different from the time period T2. In some other embodiments, the time period T1 is to the same as the time period T2.

In some embodiments, an integrated circuit is provided. The integrated circuit includes a first die comprising a first phase-locked loop (PLL), a second die comprising a second PLL and a shared loop filter. The first PLL in the first die is combined with the shared loop filter to form a first PLL feedback loop. The second PLL in the second die is combined with the shared loop filter to form a second PLL feedback loop. The shared loop filter is configured to provide configurable bandwidths to each of the first PLL feedback loop and the second PLL feedback loop.

In other embodiments, an integrated circuit is provided. The integrated circuit includes a first die comprising a first phase-locked loop (PLL), a second die comprising a second PLL, a shared phase frequency detector electrically connected to the first PLL and the second PLL, a shared charge pump electrically connected to the first PLL and the second PLL, and a shared loop filter electrically connected to the first PLL and the second PLL. The first PLL in the first die is combined with the shared phase frequency detector, the shared charge pump, and the shared loop filter to form a first PLL feedback loop. The second PLL in the second die is combined with the shared phase frequency detector, the shared charge pump, and the shared loop filter to form a second PLL feedback loop. The shared loop filter is configured to provide configurable bandwidths to one of the first PLL feedback loop and the second PLL feedback loop.

In some embodiments, an integrated circuit is provided. The integrated circuit includes a first die comprising a first phase-locked loop (PLL), a second die comprising a second PLL and a shared loop filter comprising a plurality of programmable connection elements. The first PLL in the first die is combined with the shared loop filter to form a first PLL feedback loop. The second PLL in the second die is combined with the shared loop filter to form a second PLL feedback loop. The plurality of programmable connection elements are configured to activate one of the PLL feedback loops at a time.

What is claimed is:

1. An integrated circuit die stack, comprising:
a first die comprises a first phase-locked loop (PLL);
a second die comprises a second PLL; and
a shared loop filter, wherein:
the first PLL in the first die combines with the shared loop filter to form a first PLL feedback loop;
the second PLL in the second die combines with the shared loop filter to form a second PLL feedback loop; and
the loop filter is configured to provide configurable bandwidths to each of the first PLL feedback loop and the second PLL feedback loop.

2. The integrated circuit die stack of claim 1, wherein the shared loop filter comprises a plurality of programmable connection elements, and wherein the plurality of programmable connection elements are configured to activate one of the first feedback loop and the second feedback loop at a time.

3. The integrated circuit die stack of claim 1, wherein the shared loop filter is configured to provide different configurable bandwidths to each of the first PLL feedback loop and the second PLL feedback loop.

4. The integrated circuit die stack of claim 1, wherein each of the first PLL and second PLL comprises a phase frequency detector, a charge pump, a voltage controlled oscillator and a divider.

5. The integrated circuit die stack of claim 1, wherein the loop filter comprises a plurality of capacitors, and wherein the pluralities of capacitors are formed by Metal-Insulator-Metal (MIM) capacitors and/or Metal-Oxide-Metal (MOM) capacitors.

6. The integrated circuit die stack of claim 1, further comprising an interposer, the first die physically coupled to the interposer and the second die physically coupled to the interposer.

7. The integrated circuit die stack of claim 6, wherein the shared loop filter is located at least partly inside the interposer.

8. An integrated circuit die stack, comprising:
a first die comprises a first phase-locked loop (PLL);
a second die comprises a second PLL;
a shared phase frequency detector electrically connected to the first PLL and the second PLL;
a shared charge pump electrically connected to the first PLL and the second PLL; and
a shared loop filter electrically connected to the first PLL and the second PLL, wherein:
the first PLL in the first die combines with the shared phase frequency detector, the shared charge pump, and the shared loop filter to form a first PLL feedback loop;
the second PLL in the second die combines with the shared phase frequency detector, the shared charge pump, and the shared loop filter to form a second PLL feedback loop; and
the shared loop filter is configured to provide configurable bandwidths to one of the first PLL feedback loop and the second PLL feedback loop.

9. The integrated circuit die stack of claim 8, wherein the shared loop filter comprises a plurality of programmable connection elements, and wherein the plurality of programmable connection elements are configured to activate one of the first PLL and the second PLL at a time.

10. The integrated circuit die stack of claim 8, wherein the shared loop filter is configured to provide different configurable bandwidths to each of the first PLL feedback loop and the second PLL feedback loop.

11. The integrated circuit die stack of claim 8, wherein periodic phase locking for each of the feedback loops is performed continuously during functional operations of the integrated circuit die stack.

12. The integrated circuit die stack of claim 8, wherein the shared loop filter comprises a plurality of capacitors, and wherein the pluralities of capacitors are formed by Metal-Insulator-Metal (MIM) capacitors and/or Metal-Oxide-Metal (MOM) capacitors.

13. The integrated circuit die stack of claim 8, further comprising an interposer, the first die physically coupled to the interposer and the second die physically coupled to the interposer.

14. The integrated circuit die stack of claim 6, wherein the shared loop filter is located at least partly inside the interposer.

15. An integrated circuit die stack, comprising:

a first die comprises a first phase-locked loop (PLL);

a second die comprises a second PLL; and a shared loop filter comprising a plurality of programmable connection elements, wherein:

the first PLL in the first die combines with the shared loop filter to form a first PLL feedback loop;

the second PLL in the second die combines with the shared loop filter to form a second PLL feedback loop; and     the plurality of programmable connection elements are configured to activate one of the PLL feedback loops at a time.

16. The integrated circuit die stack of claim 15, wherein shared the loop filter is configured to provide different configurable bandwidths to each of the first PLL feedback loop and the second PLL feedback loop.

17. The integrated circuit die stack of claim 15, wherein each of the first PLL and second PLL comprises a phase frequency detector, a charge pump, a voltage controlled oscillator and a divider.

18. The integrated circuit die stack of claim 15, wherein the shared loop filter comprises a plurality of capacitors, and wherein the pluralities of capacitors are formed by Metal-Insulator-Metal (MIM) capacitors and/or Metal-Oxide-Metal (MOM) capacitors.

19. The integrated circuit die stack of claim 15, further comprising an interposer that the first die is physically coupled to and the second is stacked on the first die, wherein the shared loop filter is located at least partially inside the interposer.

20. The integrated circuit die stack of claim 15, further comprising an interposer, the first die physically coupled to the interposer, the second die physically coupled to the interposer, and the shared loop filter is located at least partly inside the interposer.

\* \* \* \* \*